United States Patent
Li et al.

(10) Patent No.: US 8,242,798 B2
(45) Date of Patent: Aug. 14, 2012

(54) SIGNAL TESTING SYSTEM AND METHOD OF A PRINTED CIRCUIT BOARD

(75) Inventors: Shen-Chun Li, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 445 days.

(21) Appl. No.: 12/620,740

(22) Filed: Nov. 18, 2009

(65) Prior Publication Data

US 2010/0295552 A1    Nov. 25, 2010

(30) Foreign Application Priority Data

May 25, 2009    (CN) .......................... 2009 1 0302597

(51) Int. Cl.
  *G01R 31/28* (2006.01)
  *G01R 31/20* (2006.01)
  *G01R 31/02* (2006.01)

(52) U.S. Cl. ................ 324/763.01; 324/757.02; 324/537

(58) Field of Classification Search ............. 324/763.01, 324/757.02
See application file for complete search history.

(56) References Cited

U.S. PATENT DOCUMENTS

| 5,848,705 | A   | * | 12/1998 | Gianpaolo et al. ............ 209/571 |
| 8,035,409 | B2  | * | 10/2011 | Deutsch et al. .......... 324/763.01 |
| 8,081,008 | B2  | * | 12/2011 | Liang et al. .............. 324/754.11 |
| 2002/0030480 | A1 | * | 3/2002 | Appen et al. ................ 324/158.1 |
| 2004/0068347 | A1 | * | 4/2004 | Aalund et al. ................ 700/245 |
| 2005/0265814 | A1 | * | 12/2005 | Coady ........................ 414/744.5 |

FOREIGN PATENT DOCUMENTS

| CN | 1488321 A   | 4/2004 |
| CN | 1952673 A   | 4/2007 |
| CN | 201218817 Y | 4/2009 |

* cited by examiner

*Primary Examiner* — Jeff Natalini
(74) *Attorney, Agent, or Firm* — Altis Law Group, Inc.

(57) ABSTRACT

A signal testing method of a printed circuit board (PCB) applies a robot arm and an oscilloscope to test the PCB. The method controls the robot arm to move to test points of electronic signals of the PCB. The method further controls the oscilloscope connected to the robot arm to measure the electronic signals.

18 Claims, 3 Drawing Sheets

SIGNAL TESTING SYSTEM AND METHOD OF A PRINTED CIRCUIT BOARD

BACKGROUND

1. Technical Field

Embodiments of the present disclosure relate to circuit testing, and particularly to a signal testing system and method of a printed circuit board.

2. Description of Related Art

Signal testing of a printed circuit board (PCB), such as a motherboard, is an important phase in the manufacturing process and is closely interrelated to product quality. Currently, the signal testing of PCBs is manually operated using an oscilloscope. Because the signal testing of the PCBs involves numerous electronic signals, the manual testing can be very inconvenient and time consuming. Additionally, test points of the electronic signals in the PCBs are sometimes difficult to reach due to increasing complexity of the PCBs. A robot arm can be controlled to move to specified locations accurately and efficiently. Therefore, prompt and accurate signal test of the printed circuit board using the robot arm is desirable.

DETAILED DESCRIPTION

All of the processes described below may be embodied in, and fully automated via, functional code modules executed by one or more general purpose computers or processors. The code modules may be stored in any type of computer-readable medium or other computer storage device. Some or all of the methods may alternatively be embodied in specialized computer hardware.

Figure 1:
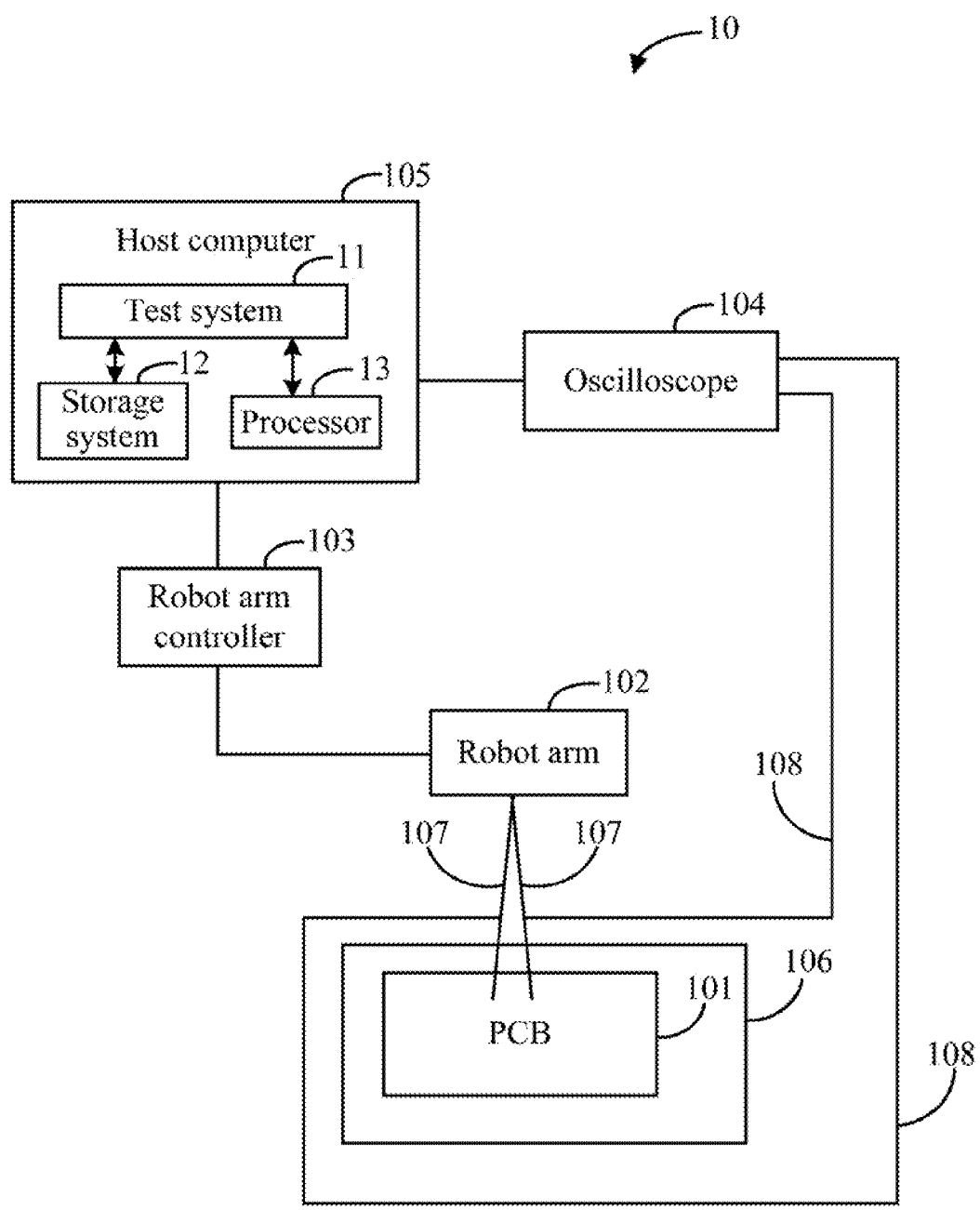
FIG. 1 is a block diagram of one embodiment of a signal testing system of a printed circuit board.

FIG. 1 is a block diagram of one embodiment of a signal testing system 10 of a printed circuit board (PCB) 101. The PCB 101 (e.g., a motherboard) may include a bare board and various electronic components, such as resistors, capacitors, and integrated circuits. In one embodiment, the signal testing system 10 includes a robot arm 102, a robot arm controller 103, an oscilloscope 104, and a host computer 105. The PCB 101 may be placed on a test rack 106. The host computer 105 is connected to the robot arm controller 103 and the oscilloscope 104 via input/output (I/O) interfaces, such as serial ports, general purpose interface bus (GPIB) ports, or local area network (LAN) ports, for example. The robot arm controller 103 is further connected to the robot arm 102. The oscilloscope 104 is connected to the robot arm 102 via a pair of oscilloscope probes 108.

The host computer 105 may include a test system 11. The test system 11 may control the robot arm 102 to move to test points of electronic signals, and control the oscilloscope 104 to measure the electronic signals. The host computer 105 may further include a storage system 12 and a processor 13. One or more computerized codes of the test system 11 may be stored in the storage system 12 and executed by the processor 13.

In one embodiment, each electronic signal of the PCB 101 to be tested corresponds a pair of test points in the PCB 101. For example, a single-ended signal has a signal test point and a ground test point. A differential signal has a pair of differential signal test points. The robot arm 102 may be equipped with a pair of robot arm probes 107 at a front end, where the robot arm probes 107 are connected to the oscilloscope probes 108. The robot arm probes 107 are moved to the pair of test points when the electronic signal is tested. Depending on the embodiment, the robot arm 102 may hold the oscilloscope probes 108 and position the oscilloscope probes 108 to the pair of test points.

In one embodiment, the host computer 105 may control the robot arm 102 via the robot arm controller 103. Depending on the embodiment, the host computer 105 may control the robot arm 102 directly.

Figure 2:
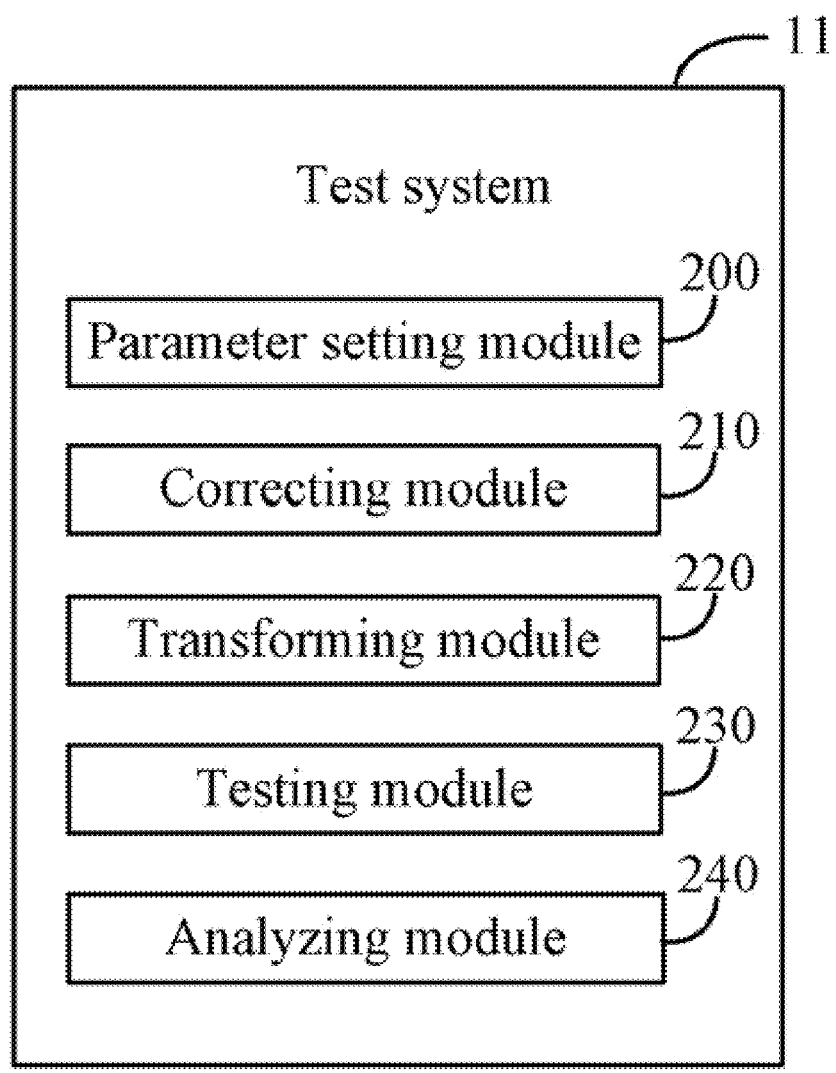
FIG. 2 is a block diagram of one embodiment of a test system comprising function modules.

FIG. 2 is a block diagram of one embodiment of the test system 11 comprising function modules. In one embodiment, the test system 11 may include a parameter setting module 200, a correcting module 210, a transforming module 220, a testing module 230, and an analyzing module 240.

The parameter setting module 200 is operable to set test parameters of the PCB 101. In one embodiment, the test parameters include electronic components of the PCB 101 to be tested, electronic signals of each of the electronic components to be tested, test points of each of the electronic signals, coordinates of each of the test points in a first coordinate system of the PCB 101, test items of each of the electronic signals, and a theoretical value of each of the test items.

The correcting module 210 is operable to correct an initial position of the robot arm 102, so as to ensure a location accuracy of the robot arm 102.

The transforming module 220 is operable to determine a transformational relationship between the first coordinate system of the PCB 101 and a second coordinate system of the robot arm 102. Further details of the transformational relationship will be explained below.

The testing module 230 is operable to select the electronic signals to be tested one by one and test the selected electronic signal. For each selected electronic signal, the testing module 230 first calculates coordinates of the test points of the selected signal in the second coordinate system according to the transformational relationship between the first coordinate system and the second coordinate system. The testing module 230 controls the robot arm 102 to move to the test points of the selected electronic signal, and control the oscilloscope 104 to measure the test items, such as a period, a positive pulse width, a negative pulse width, a rise time, and a fall time, of the selected electronic signal. Finally, the testing module 230 receives measured values of the test items from the oscilloscope 104, and stores the measured values into the storage system 12.

The analyzing module 240 is operable to analyze the measured values of the test items of each selected electronic signal, and store the analysis result into the storage system 12. The analysis of the measured values may include determining if the measured value of each test item is acceptable.

Figure 3:
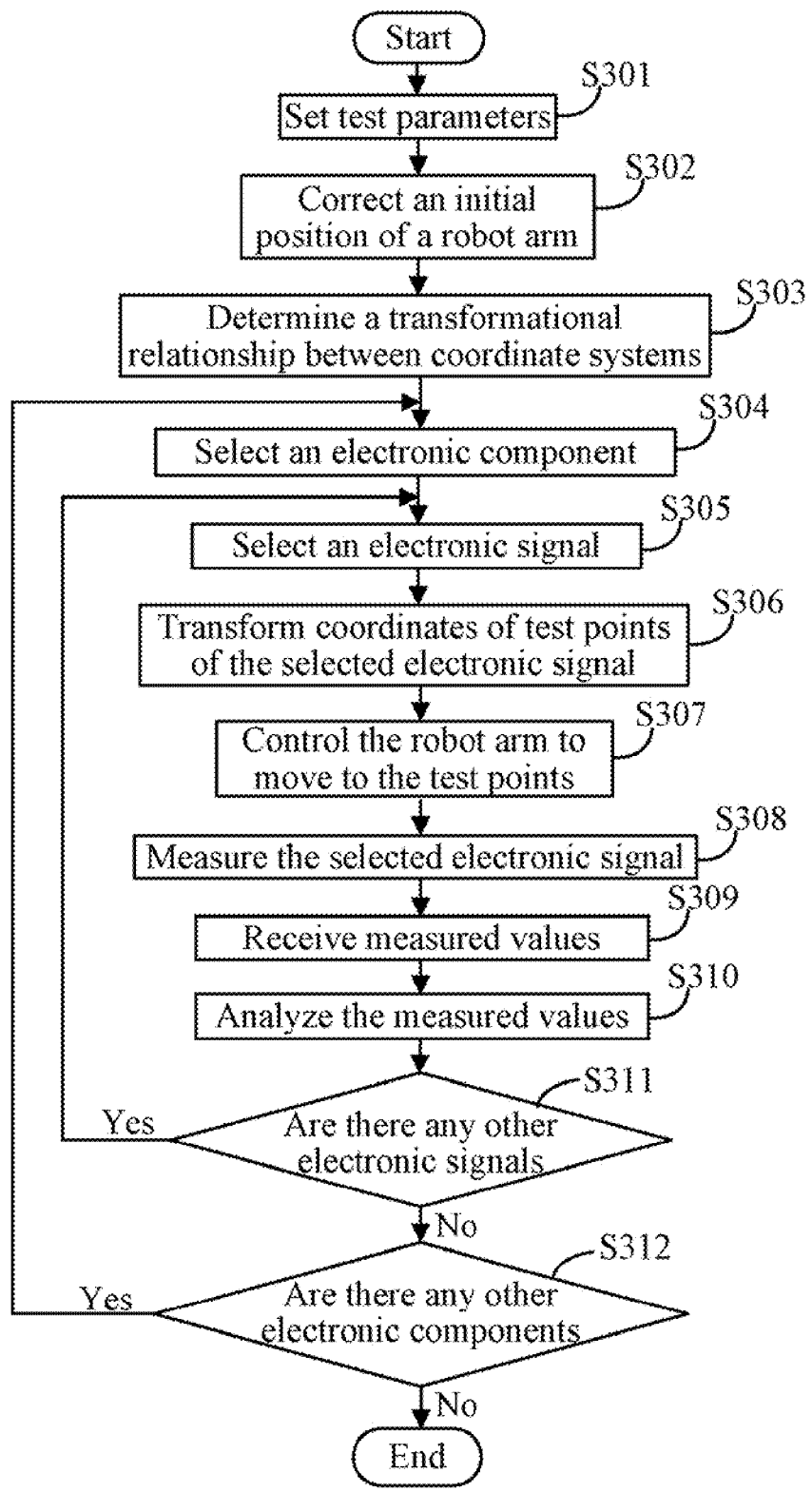
FIG. 3 is a flowchart of one embodiment of a signal testing method of a printed circuit board.

FIG. 3 is a flowchart of one embodiment of a signal testing method of the PCB 101. The method may control the robot arm 102 to move to test points of electronic signals, and control the oscilloscope 104 to measure the electronic signals. Depending on the embodiments, additional blocks may be added, others removed, and the ordering of the blocks may be changed.

In block S301, the parameter setting module 200 sets test parameters of the PCB 101. As mentioned above, the test parameters include electronic components of the PCB 101 to be tested, electronic signals of each of the electronic components to be tested, test points of each of the electronic signals, coordinates of each of the test points in a first coordinate system of the PCB 101, test items of each of the electronic signals, and a theoretical value of each of the test items.

In one embodiment, the test points include via holes, pads, and pins in the PCB 101. The test items include various time and voltage measurements, such as overshot, undershot, period, positive pulse width, negative pulse width, rise time, and fall time. The theoretical value may be a certain value, such as 25 ns, or a range of value, such as a range of [10 ns, 12 ns].

In block S302, the correcting module 210 corrects an initial position of the robot arm 102, so as to ensure a location accuracy of the robot arm 102. In one embodiment, the correcting module 210 sends a correction command to the robot arm controller 103. In respond to the correction command, the robot arm controller 103 controls the robot arm 102 to correct the initial position.

In block S303, the transforming module 220 determines a transformational relationship between the first coordinate system of the PCB 101 and a second coordinate system of the robot arm 102. In one embodiment, the transforming module 220 calculates a transition matrix from the first coordinate system to the second coordinate system to represent the transformational relationship. It may be understood that coordinates of a point in the second coordinate system may be obtained by multiplying the coordinates of the point in the first coordinate system by the transition matrix.

In block S304, the testing module 230 selects one of the electronic components to be tested.

In block S305, the testing module 230 selects one of the electronic signals to be tested of the selected electronic component.

In block S306, the testing module 230 transforms the coordinates of the test points of the selected electronic signal in the first coordinate system into coordinates of the test points of the selected electronic signal in the second coordinate system. The transformation may be done according to the transformational relationship between the first coordinate system and the second coordinate system. In one embodiment, the transformational relationship is represented as a transition matrix from the first coordinate system to the second coordinate system. The testing module 230 may multiply the coordinates of the test points of the selected electronic signal in the first coordinate system by the transition matrix, so as to obtain the coordinates of the test points of the selected electronic signal in the second coordinate system.

In block S307, the testing module 230 controls the robot arm 102 to move to the test points of the selected electronic signal according to the calculated coordinates. As such, the selected electronic signal transmits from the PCB 101 to the oscilloscope 104. In one embodiment, the testing module 230 sends a location command that contains the calculated coordinates to the robot arm controller 103. In response to the location command, the robot arm controller 103 drives the robot arm 102 to move to the test points of the selected electronic signal.

In block S308, the testing module 230 controls the oscilloscope 104 to measure the test items of the selected electronic signal.

In block S309, the testing module 230 receives measured values of the test items of the selected electronic signal from the oscilloscope 104, and stores the measured values into the storage system 12. In one embodiment, the measured values may be stored in a first predetermined storage path, such as F:\PCBTest\Result.

In block S310, the analyzing module 240 analyzes the measured values, and stores the analysis result into the storage system 12. The analysis of the measured values may include determining if the measured values are acceptable. In one example, a theoretical value of a period of a clock signal is set as 25 ns. If the measured value of the period of the clock signal is 24 ns, the analyzing module 240 may determined that the measured value of the period of the clock signal is unacceptable. In one embodiment, the analysis result may be stored in a second predetermined storage path, such as F:\PCBTest\Analysis.

In block S311, the testing module 230 determines if there are any other electronic signals of the selected electronic components that have not been selected. If there are any other electronic signals that have not been selected, then the flow may return to block S305. If there are no any other electronic signal to be selected, then the flow goes block S312 as described below.

In block S312, the testing module 230 determines if there are any other electronic components of the PCB 101 that have not been selected. If there are any other electronic components that have not been selected, then the flow may return to block S304. If there are no any other electronic component of the PCB 101 to be selected, then the flow ends.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A signal testing system of a printed circuit board (PCB), the signal testing system electronically connected to a robot arm and an oscilloscope, the robot arm electronically connected to the oscilloscope, the signal testing system comprising:

a parameter setting module operable to set test parameters of the PCB, the test parameters comprising electronic components of the PCB to be tested, electronic signals of each of the electronic components to be tested, test points of each of the electronic signals, coordinates of each of the test points in a first coordinate system of the PCB, and test items of each of the electronic signals;

a correcting module operable to correct an initial position of the robot arm;

a transforming module operable to determine a transformational relationship between the first coordinate system of the PCB and a second coordinate system of the robot arm;

a testing module operable to transform the coordinates of the test points of each of the electronic signals in the first coordinate system into coordinates of the test points of the electronic signal in the second coordinate system according to the transformational relationship between the first coordinate system and the second coordinate system;

the testing module further operable to control the robot arm to move to the test points of each of the electronic signals according to the coordinates of the test points in the second coordinate system, and control the oscilloscope to measure the test items of the electronic signal; and the testing module further operable to receive measured values of the test items from the oscilloscope, and store the measured values into a storage system of the signal testing system.

2. The signal testing system of claim 1, further comprising:

an analyzing module operable to analyze the measured values, and store the analysis result into the storage system.

3. The signal testing system of claim 1, wherein the correcting module corrects the initial position of the robot arm via a robot arm controller, and the testing module controls the robot arm to move to the test points of the electronic signal via the robot arm controller.

4. The signal testing system of claim 1, wherein the transforming module calculates a transition matrix from the first coordinate system to the second coordinate system to represent the transformational relationship between the first coordinate system and the second coordinate system.

5. The signal testing system of claim 4, wherein the testing module multiplies the coordinates of the test points of the electronic signal in the first coordinate system by the transition matrix to obtain the coordinates of the test points of the electronic signal in the second coordinate system.

6. The signal testing system of claim 1, wherein the test points include via holes, pads, and pins in the PCB.

7. A signal testing method of a printed circuit board (PCB), the method comprising:
(a) setting test parameters of the PCB, the test parameters comprising electronic components of the PCB to be tested, electronic signals of each of the electronic components to be tested, test points of each of the electronic signals, coordinates of each of the test points in a first coordinate system of the PCB, and test items of each of the electronic signals;
(b) correcting an initial position of a robot arm that is used to move to the test points;
(c) determining a transformational relationship between the first coordinate system of the PCB and a second coordinate system of the robot arm;
(d) selecting one of the electronic components;
(e) selecting one of the electronic signals of the selected electronic component;
(f) transforming the coordinates of the test points of the selected electronic signal in the first coordinate system into coordinates of the test points of the selected electronic signal in the second coordinate system according to the transformational relationship between the first coordinate system and the second coordinate system;
(g) controlling the robot arm to move to the test points of the selected electronic signal according to the coordinates of the test points of the selected electronic signal in the second coordinate system;
(h) controlling an oscilloscope connected to the robot arm to measure the test items of the selected electronic signal;
(i) receiving measured values of the test items of the selected electronic signal from the oscilloscope, and storing the measured values into a storage system;
(j) repeating block (e) to block (i) until all electronic signals of the selected electronic component that have been selected; and
(k) repeating block (d) to block (i) until all electronic components of the PCB that have been selected.

8. The method of claim 7, further comprising:
analyzing the measured values and storing the analysis result into the storage system after storing the measured values into the storage system in block (i).

9. The method of claim 7, wherein the initial position of the robot arm is corrected via a robot arm controller, and the robot arm is controlled to move to the test points of the selected electronic signal via the robot arm controller.

10. The method of claim 7, wherein the transformational relationship between the first coordinate system of the PCB and a second coordinate system of the robot arm is represented as a transition matrix from the first coordinate system to the second coordinate system.

11. The method of claim 10, wherein the coordinates of the test points of the selected electronic signal in the second coordinate system is obtained by multiplying the coordinates of the test points of the selected electronic signal in the first coordinate system by the transition matrix.

12. The method of claim 7, wherein the test points include via holes, pads, and pins in the PCB.

13. A computer-readable non-transitory medium having stored thereon instructions that, when executed by a computerized device, cause the computerized device to execute a method for testing signals of a printed circuit board (PCB), the method comprising:
(a) setting test parameters of the PCB, the test parameters comprising electronic components of the PCB to be tested, electronic signals of each of the electronic components to be tested, test points of each of the electronic signals, coordinates of each of the test points in a first coordinate system of the PCB, and test items of each of the electronic signals;
(b) correcting an initial position of a robot arm that is used to move to the test points;
(c) determining a transformational relationship between the first coordinate system of the PCB and a second coordinate system of the robot arm;
(d) selecting one of the electronic components;
(e) selecting one of the electronic signals of the selected electronic component;
(f) transforming the coordinates of the test points of the selected electronic signal in the first coordinate system into coordinates of the test points of the selected electronic signal in the second coordinate system according to the transformational relationship between the first coordinate system and the second coordinate system;
(g) controlling the robot arm to move to the test points of the selected electronic signal according to the coordinates of the test points of the selected electronic signal in the second coordinate system;
(h) controlling an oscilloscope connected to the robot arm to measure the test items of the selected electronic signal;
(i) receiving measured values of the test items of the selected electronic signal from the oscilloscope, and storing the measured values into a storage system;
(j) repeating block (e) to block (i) until all electronic signals of the selected electronic component that have been selected; and
(k) repeating block (d) to block (i) until all electronic components of the PCB that have been selected.

14. The medium of claim 13, wherein the method further comprises:
analyzing the measured values and storing the analysis result into the storage system after storing the measured values into the storage system in block (i).

15. The medium of claim 13, wherein the initial position of the robot arm is corrected via a robot arm controller, and the robot arm is controlled to move to the test points of the selected electronic signal via the robot arm controller.

16. The medium of claim 13, wherein the transformational relationship between the first coordinate system of the PCB and a second coordinate system of the robot arm is represented as a transition matrix from the first coordinate system to the second coordinate system.

17. The medium of claim 16, wherein the coordinates of the test points of the selected electronic signal in the second coordinate system is obtained by multiplying the coordinates of the test points of the selected electronic signal in the first coordinate system by the transition matrix.

18. The medium of claim 13, wherein the test points include via holes, pads, and pins in the PCB.

* * * * *